(12) United States Patent
Chen et al.

(10) Patent No.: US 12,372,396 B2
(45) Date of Patent: Jul. 29, 2025

(54) TEST SYSTEM AND METHOD

(71) Applicant: NANYA TECHNOLOGY CORPORATION, New Taipei (TW)

(72) Inventors: Chien Yu Chen, New Taipei (TW); Meng-Kai Hsieh, Nantou County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 279 days.

(21) Appl. No.: 18/047,652

(22) Filed: Oct. 19, 2022

(65) Prior Publication Data
US 2024/0133737 A1   Apr. 25, 2024
US 2024/0230401 A9   Jul. 11, 2024

(51) Int. Cl.
*G06F 11/00*   (2006.01)
*G01H 13/00*   (2006.01)
*G11C 29/08*   (2006.01)
*G11C 29/44*   (2006.01)

(52) U.S. Cl.
CPC ............. *G01H 13/00* (2013.01); *G11C 29/08* (2013.01); *G11C 29/44* (2013.01)

(58) Field of Classification Search
CPC .. G06F 11/22; G06F 11/3034; G06F 11/0778; G06F 11/3072
USPC ........................................................ 714/1–57
See application file for complete search history.

(56) References Cited

U.S. PATENT DOCUMENTS

| | | | |
|---|---|---|---|
| 7,231,551 B1* | 6/2007 | Treue .................. | G06F 11/3636 714/724 |
| 2004/0139374 A1* | 7/2004 | Meaney ............... | G06F 11/0724 714/48 |
| 2006/0294422 A1* | 12/2006 | Fukuda ............... | G06F 11/0793 714/15 |
| 2009/0243627 A1* | 10/2009 | Komura ......... | G01R 31/318533 324/537 |
| 2014/0006863 A1* | 1/2014 | Yang ..................... | G11C 29/36 714/30 |
| 2015/0127986 A1 | 5/2015 | Tahara et al. | |
| 2017/0164369 A1* | 6/2017 | Lin .................. | H04W 72/0466 |
| 2018/0348300 A1 | 12/2018 | Brief et al. | |
| 2020/0278662 A1* | 9/2020 | Hashimoto ........ | G05B 19/4186 |
| 2024/0004752 A1* | 1/2024 | Storm ................. | G06F 11/1008 |
| 2024/0105360 A1* | 3/2024 | Kao ........................ | H02J 1/084 |

FOREIGN PATENT DOCUMENTS

CN   109408312 A   3/2019

\* cited by examiner

*Primary Examiner* — Sarai E Butler
(74) *Attorney, Agent, or Firm* — CKC & Partners Co., LLC

(57) ABSTRACT

The present disclosure provides a test system and method. The test system is configured to analyze a system platform and includes a data collector and a test monitor. The data collector is configured to receive a signal transmitted between a controller and a memory of the system platform and is configured to process the signal to generate a processed signal. The test monitor is configured to encode the processed signal into a log information, so as to determine an operation status of the system platform according to the log information.

20 Claims, 2 Drawing Sheets

TEST SYSTEM AND METHOD

BACKGROUND

Field of Invention

This disclosure relates to a system and method, and in particular to a test system and test method.

Description of Related Art

With the development of technology, more and more system analysis approaches have been proposed. Some of the system analysis approaches use the logic analyzer to analyze operation sequence of memory (e.g., a dynamic random access memory (DRAM)). However, those approaches using the logic analyzer cannot obtain whole operation sequence of the memory due to the limited storage space of the logic analyzer. Furthermore, as the processing speed of memory increases, the signal transmitted in a transmission line cooperated with the logic analyzer often occurs distortion. For this reason, the user may hardly find the errors in system and needs to repeat test operation multiple times.

SUMMARY

An aspect of present disclosure relates to a test system. The test system is configured to analyze a system platform and includes a data collector and a test monitor. The data collector is configured to receive a signal transmitted between a controller and a memory of the system platform and is configured to process the signal to generate a processed signal. The test monitor is configured to encode the processed signal into a log information, so as to determine an operation status of the system platform according to the log information.

Another aspect of present disclosure relates to a test method. The test method includes: by a data collector, receiving a signal transmitted between a controller and a memory of a system platform; by the data collector, processing the signal to generate a processed signal; and by a test monitor, generating a log information according to the processed signal, so as to determine an operation status of the system platform according to the log information.

It is to be understood that both the foregoing general description and the following detailed description are by examples, and are intended to provide further explanation of the invention as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiments are described in detail below with reference to the appended drawings to better understand the aspects of the present application. However, the provided embodiments are not intended to limit the scope of the disclosure, and the description of the structural operation is not intended to limit the order in which they are performed. Any device that has been recombined by components and produces an equivalent function is within the scope covered by the disclosure.

As used herein, "coupled" and "connected" may be used to indicate that two or more elements physical or electrical contact with each other directly or indirectly, and may also be used to indicate that two or more elements cooperate or interact with each other.

Figure 1:
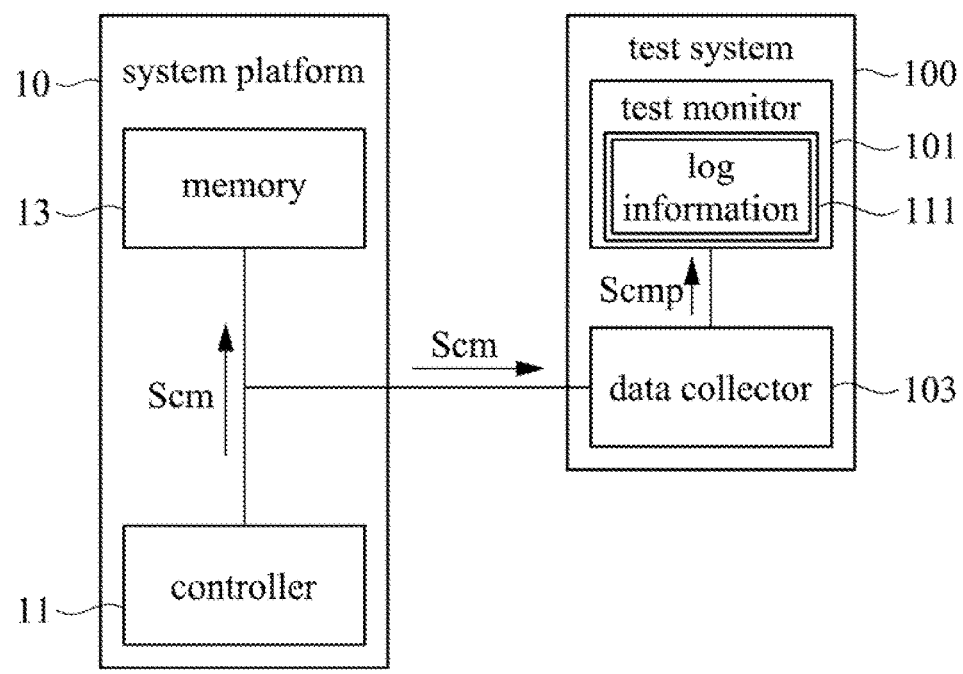
FIG. 1 is a block diagram of a system platform and a test system in accordance with some embodiments of the present disclosure.

Referring to FIG. 1, FIG. 1 is a block diagram of a system platform 10 and a test system 100 in accordance with some embodiments of the present disclosure. In some embodiments, the test system 100 is configured to analyze the system platform 10, so that an operation status of the system platform 10 can be determined.

In some embodiments, as shown in FIG. 1, the system platform 10 includes a controller 11 and a memory 13. In particular, the system platform 10 can be implemented by a desktop computer, a laptop computer, a tablet computer or a mobile device (e.g., smartphone). The controller 11 can be implemented by a central processing unit (CPU), an application-specific integrated circuit (ASIC), a microprocessor or a system on a Chip (SoC). In addition, the memory 13 can be implemented by a dynamic random access memory (DRAM) or a static random access memory (SRAM).

As shown in FIG. 1, a signal Scm is transmitted between the controller 11 and the memory 13. In some embodiments, the signal Scm is a clock signal, a command signal, an address signal, a data signal or a combination thereof. In some practical applications, the clock signal, the command signal and the address signal each can only be transmitted from the controller 11 to the memory 13. In some practical applications, the address signal and the data signal each can be transmitted from the controller 11 to the memory 13 and can also be transmitted from the memory 13 to the controller 11. It can be seen that the transmission of the signal Scm can be unidirectional and can also be bidirectional.

In some embodiments, as shown in FIG. 1, the test system 100 includes a test monitor 101 and a data collector 103. In particular, the test monitor 101 can be implemented by a desktop computer or a laptop computer, and the data collector 103 can be implemented by a circuit module or a chip module.

As shown in FIG. 1 again, the data collector 103 is configured to receive the signal Scm and is configured to process the signal Scm to generate a processed signal Scmp. For example, in some embodiments, after receiving the signal Scm, the data collector 103 performs a frequency reduction on the signal Scm. In other words, the data collector 103 lowers a frequency of the signal Scm to generate the processed signal Scmp. It can be appreciated that the processed signal Scmp is lower than the signal Scm in frequency. Thereafter, the data collector 103 is configured to transmit the processed signal Scmp to the test monitor 101.

In some embodiments, the test monitor 101 is configured to encode the processed signal Scmp into a log information. As shown in FIG. 1, the test monitor 101 can include a storage unit 111, and the test monitor 101 can store the log information in the storage unit 111 after generating the log information. In particular, the storage unit 111 can be implemented by a hard disk drive (HDD) or a solid state drive (SSD). It can be appreciated that the test monitor 101 can also store the processed signal Scmp in the storage unit 111. Notably, the test monitor 101 provides enough storage space for the processed signal Scmp and/or the log information (which is corresponding to the operation sequence of the system platform 10).

In some embodiments, the operation status of the system platform 10 can be determined according to the log information. For example, it can be determined that the system platform 10 is normal or abnormal according to the log information. Further, in some embodiments, some data (e.g., a core timing of the memory 13, a clock speed, etc.) can be calculated from the log information by the test monitor 101, and the test monitor 101 can show a variety of data (i.e., the processed signal Scmp, the log information and/or the data calculated from the log information) of the system platform 10 by its display. In some practical applications, based on the variety of data of the system platform 10, it can be determined whether the commands transmitted between the controller 11 and the memory 13 are legal and whether the mode register setting (MRS) meets the Joint Electron Device Engineering Council (JEDEC) standard definition. In brief, the user of the test system 100 can easily determine whether the system platform 10 operates normally and find out the reason behind the errors in the system platform 10 according to the variety of data of the system platform 10. The determination of the operation status of the system platform 10 according to the log information is well known to the person skilled in the art of the present disclosure, and therefore would not be described in detail herein.

Figure 2:
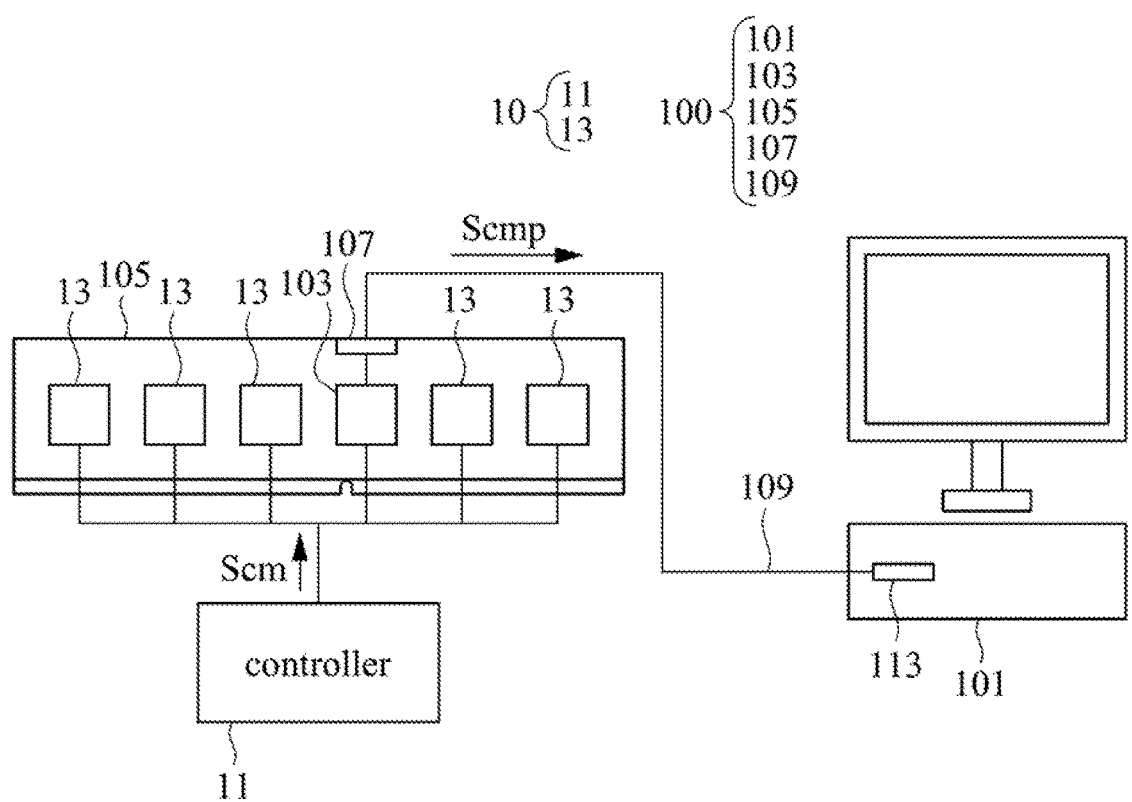
FIG. 2 is schematic diagram of the system platform and the test system in accordance with some embodiments of the present disclosure.

Referring to FIG. 2, FIG. 2 is a schematic diagram of the system platform 10 and the test system 100 in accordance with some embodiments of the present disclosure. In some embodiments, as shown in FIG. 2, in addition to the test monitor 101 and the data collector 103, the test system 100 further includes a circuit substrate 105, a first connection interface 107 and a transmission line 109.

In the embodiments of FIG. 2, the memory 13, the data collector 103 and the first connection interface 107 are arranged on the circuit substrate 105. The controller 11 is coupled to the circuit substrate 105, and the signal Scm is transmitted between the controller 11 and the memory 13 via the circuit substrate 105. Accordingly, the data collector 103 is configured to receive the signal Scm via the circuit substrate 105. As the descriptions of FIG. 1, the data collector 103 then processes the signal Scm to generate the processed signal Scmp. In addition, the first connection interface 107 is coupled to the data collector 103, so that the data collector 103 is further configured to transmit the processed signal Scmp via the first connection interface 107.

In some embodiments, as shown in FIG. 2, the test monitor 101 further includes a second connection interface 113. The transmission line 109 is coupled between the first connection interface 107 and the second connection interface 113, and the processed signal Scmp is transmitted from the first connection interface 107 to the second connection interface 113 via the transmission line 109. Accordingly, the test monitor 101 is configured to receive the processed signal Scmp via the second connection interface 113. Thereafter, as the descriptions of FIG. 1, the test monitor 101 generates the log information according to the processed signal Scmp, so that the operation status of the system platform 10 can be obtained.

In the embodiments of FIG. 2, the first connection interface 107 and the second connection interface 113 each can be implemented by a Universal Serial Bus (USB) connection interface (e.g., USB Type-C), and the transmission line 109 can be implemented by a USB transmission line.

Figure 3:
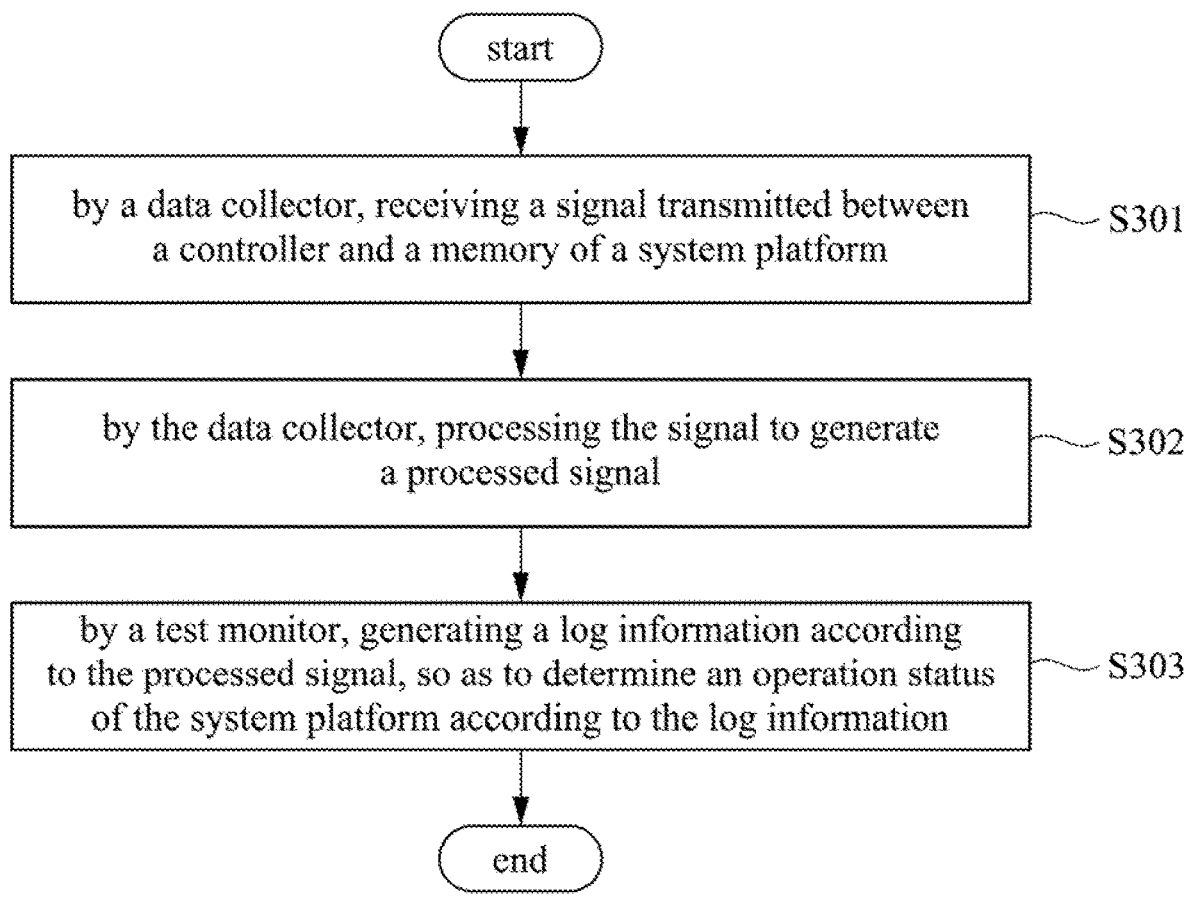
FIG. 3 is a flow diagram of a test method in accordance with some embodiments of the present disclosure.

Referring to FIG. 3, FIG. 3 is a flow diagram of a test method 300 in accordance with some embodiments of the present disclosure. The test method 300 can be applied to the test system 100 of FIGS. 1 and 2. As shown in FIG. 3, the test method 300 includes steps S301-S303.

In step S301, the data collector 103 receives the signal Scm transmitted between the controller 11 and the memory 13 of the system platform 10. In step S302, the data collector 103 processes the signal Scm to generate the processed signal Scmp. In step S303, the test monitor 101 generates the log information according to the processed signal Scmp, so as to determine the operation status of the system platform 10 according to the log information. The operations of steps S301-S303 are similar to those of the embodiments of FIGS. 1 and 2, and therefore the descriptions thereof are omitted herein.

It can be appreciated that the embodiments of FIG. 3 are only examples and are not intended to limit the present disclosure. For example, in some embodiments, before step S301, the signal Scm is transmitting between the controller 11 and the memory 13 via the circuit substrate 105. In some embodiments, between step S302 and step S303, the data collector 103 transmits the processed signal Scmp via the first connection interface 107, the transmission line 109 transmits the processed signal Scmp from the first connection interface 107 to the second connection interface 113, and the test monitor 101 receives the processed signal Scmp via the second connection interface 113. That is, between step S302 and step S303, the processed signal Scmp is transmitted from the data collector 103 to the test monitor 101.

Furthermore, in some embodiments, before the step of transmitting the signal Scm between the controller 11 and the memory 13 via the circuit substrate 105 or after step S303, a set of the memory 303 (as shown in FIG. 2) currently soldered on the circuit substrate 105 is removed from the circuit substrate 105, and another set of the memory 303 is then soldered on the circuit substrate 105. It can be seen that the test system 100 can analyze a variety of system platform by switching the controller 11 and the memory 13 which are coupled to the circuit substrate 105.

Notably, in the above embodiments, the data collector 103 can receive the signal Scm at a time that the controller 11 and the memory 13 start to transmit the signal Scm therebetween and can stop receiving the signal Scm at a time that the controller 11 and the memory 13 stop transmitting the signal Scm therebetween. In other words, the data collector 103 can collect all the signals transmitted between the controller 11 and the memory 13 at one time, so that the user of the test system 100 would not have to repeat the test operation.

It can be appreciated that the present disclosure is not limited herein. In other embodiments, the user of the test system 100 can preset a collecting condition, and the data collector 103 can collect part of the signals transmitted between the controller 11 and the memory 13 according to the collecting condition. Furthermore, in some embodiments, although the data collector 103 collects all the signals transmitted between the controller 11 and the memory 13, the user can operate the test monitor 101 to analyze part of the signals according to another collecting condition set by him/her. In brief, the test system 100 can provide a customized analysis to meet the requirements of the user.

In some practical applications, both the processing speed of the controller 11 and the processing speed of the memory 13 are high. In such conditions, the signal Scm transmitted between the controller 11 and the memory 13 would be distorted when being directly transmitted via the transmission line 109. Notably, the test system 100 utilizes the data collector 103 to process the signal Scm, so as to avoid the signal Scm being directly transmitted via the transmission line 109. Therefore, the test monitor 101 would hardly receive distorted signals.

In the above embodiments, the test system 100 utilizes a common computer (i.e., the test monitor 101) and signal transmission approach (i.e., the transmission line 109 and the first connection interface 107) to perform the logic analysis, so that the cost for the logic analysis would be reduced in comparison to the known technology using the commercial logic analyzer.

In sum, the test system 100 and the test method 300 of the present disclosure has the advantage of improved efficiency of analysis, short verification period of system, convenience of the user and lower cost in comparison to the known technology.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the invention. In view of the foregoing, it is intended that the present invention cover modifications and variations of this invention provided they fall within the scope of the following claims.

What is claimed is:

1. A test system configured to analyze a system platform, comprising:
    a data collecting circuit configured to receive a signal transmitted between a controller and a memory of the system platform and configured to process the signal to generate a processed signal; and
    a computer device configured to encode the processed signal into a log information, so as to determine an operation status of the system platform according to the log information.

2. The test system of claim 1, wherein the data collecting circuit is configured to perform a frequency reduction on the signal to generate the processed signal.

3. The test system of claim 1, wherein a frequency of the processed signal is lower than a frequency of the signal.

4. The test system of claim 1, wherein the data collecting circuit is configured to transmit the processed signal to the computer device.

5. The test system of claim 1, wherein the test system further comprises a circuit substrate, the data collecting circuit and the memory are arranged on the circuit substrate, the signal is transmitted between the controller and the memory via the circuit substrate, and the data collecting circuit is configured to receive the signal via the circuit substrate.

6. The test system of claim 5, wherein the test system further comprises a first connection interface, the first connection interface is arranged on the circuit substrate and is coupled to the data collecting circuit, and the data collecting circuit is configured to transmit the processed signal via the first connection interface.

7. The test system of claim 6, wherein the first connection interface is a Universal Serial Bus (USB) connection interface.

8. The test system of claim 6, wherein the computer device comprises a second connection interface, and the computer device is configured to receive the processed signal via the second connection interface.

9. The test system of claim 8, wherein the second connection interface is a Universal Serial Bus (USB) connection interface.

10. The test system of claim 8, wherein the test system further comprises a transmission line, and the transmission line is coupled between the first connection interface and the second connection interface and is configured to transmit the processed signal from the first connection interface to the second connection interface.

11. A test method, comprising:
    by a data collector, receiving a signal transmitted between a controller and a memory of a system platform;
    by the data collector, processing the signal to generate a processed signal; and
    by a test monitor, generating a log information according to the processed signal, so as to determine an operation status of the system platform according to the log information.

12. The test method of claim 11, wherein processing the signal to generate a processed signal comprises:
    performing a frequency reduction on the signal to generate the processed signal.

13. The test method of claim 11, wherein processing the signal to generate a processed signal comprises:
    lowering a frequency of the signal, so that the processed signal is lower than the signal in frequency.

14. The test method of claim 11, further comprising:
    transmitting the processed signal from the data collector to the test monitor.

15. The test method of claim 11, further comprising:
    transmitting the signal between the controller and the memory via a circuit substrate, wherein the data collector receives the signal via the circuit substrate.

16. The test method of claim 15, further comprising:
    by the data collector, transmitting the processed signal via a first connection interface arranged on the circuit substrate.

17. The test method of claim 16, wherein the first connection interface is a Universal Serial Bus (USB) connection interface.

18. The test method of claim 16, further comprising:
    by the test monitor, receiving the processed signal via a second connection interface of the test monitor.

19. The test method of claim 18, wherein the second connection interface is a Universal Serial Bus (USB) connection interface.

20. The test method of claim 18, further comprising:
    transmitting the processed signal from the first connection interface to the second connection interface via a transmission line coupled between the first connection interface and the second connection interface.

* * * * *